(12) United States Patent
Takanashi

(10) Patent No.: US 8,187,378 B2
(45) Date of Patent: May 29, 2012

(54) SILICON SINGLE CRYSTAL PULLING METHOD

(75) Inventor: Keiichi Takanashi, Tokyo (JP)

(73) Assignee: Sumco Corporation, Tokyo (JP)

( * ) Notice: Subject to any disclaimer, the term of this patent is extended or adjusted under 35 U.S.C. 154(b) by 926 days.

(21) Appl. No.: 12/199,070

(22) Filed: Aug. 27, 2008

(65) Prior Publication Data
US 2009/0064923 A1 Mar. 12, 2009

(30) Foreign Application Priority Data

Aug. 29, 2007 (JP) ................................ 2007-223059

(51) Int. Cl.
*C30B 15/20* (2006.01)
(52) U.S. Cl. ................ 117/15; 117/11; 117/13; 117/14; 117/932
(58) Field of Classification Search .................... 117/11, 117/13, 14, 15, 932
See application file for complete search history.

(56) References Cited

U.S. PATENT DOCUMENTS

| | | | |
|---|---|---|---|
| 4,794,263 A | 12/1988 | Katsuoka et al. | |
| 5,078,830 A * | 1/1992 | Shirata et al. | 117/17 |
| 5,918,196 A * | 6/1999 | Jacobson | 702/97 |
| 6,341,173 B2 * | 1/2002 | Altekruger et al. | 382/141 |
| 2002/0029734 A1* | 3/2002 | Mizuta et al. | 117/14 |
| 2002/0043206 A1* | 4/2002 | Mutti et al. | 117/14 |

FOREIGN PATENT DOCUMENTS

| | | |
|---|---|---|
| CN | 1396965 | 2/2003 |
| JP | 5-279174 | 10/1993 |
| JP | 6-234593 | 8/1994 |
| JP | 7-309694 | 11/1995 |
| JP | 8-239293 | 9/1996 |
| JP | 2001-019588 | 1/2001 |
| JP | 2001-510141 | 7/2001 |
| JP | 2005-41705 | 2/2005 |
| JP | 2005-179123 | 7/2005 |
| KR | 10-2006-0128033 | 12/2006 |
| KR | 10-0835050 | 6/2008 |
| WO | 99/04066 | 1/1999 |
| WO | 01/57294 | 8/2001 |

OTHER PUBLICATIONS

English Language Abstract of JP 6-234593, 1994
English Language Abstract of JP 5-279174, 1993.

(Continued)

*Primary Examiner* — Matthew Song
(74) *Attorney, Agent, or Firm* — Greenblum & Bernstein, P.L.C.

(57) ABSTRACT

An object of the present invention is to provide a silicon single crystal pulling method of accurately controlling the diameter of a silicon single crystal, thereby obtaining a high-quality silicon single crystal with little crystal defect.

According to an aspect of the present invention, the pulling step includes: capturing an image of the silicon single crystal using an imaging device; measuring the brightness distribution of a fusing ring generated in the vicinity of a solid-liquid interface between the silicon melt and the silicon single crystal for each image scan line in the image captured by the imaging device; detecting the liquid level of the silicon melt and the position of the solid-liquid interface; and controlling the diameter of the silicon single crystal on the basis of a meniscus height, which is a difference between the liquid level and the position of the solid-liquid interface.

12 Claims, 4 Drawing Sheets

OTHER PUBLICATIONS

English Language Abstract of JP 7-309694, 1995.
English Language Abstract of JP 2005-41705, 2005.
Chinese Office Action that issued with respect to Chinese Patent Application No. 200810171401.8 on Dec. 6, 2010, along with an English language translation thereof.
Korean Office Action issued with respect to Korean Patent Application No. 10-2008-0085037, dated Feb. 23, 2011, along with an English language translation.
English language Abstract for KR 10-2007-0115711, published Dec. 6, 2007, corresponding to KR 10-0835050.
German Office Action that issued with respect to German Patent Application No. 10 2008 044 761.7, dated May 26, 2010, along with an English language translation thereof.
Korean Office Action that issued with respect to Korean Patent Application No. 10-2008-0085037 on Aug. 10, 2010, along with an English language translation thereof.

* cited by examiner

SILICON SINGLE CRYSTAL PULLING METHOD

TECHNICAL FIELD

The present invention relates to a silicon single crystal pulling method of accurately controlling the diameter of a silicon single crystal when the silicon single crystal is pulled up from a silicon melt by a Czochralski method, thereby obtaining a high-quality silicon single crystal with little crystal defect.

BACKGROUND ART

Various methods of manufacturing a silicon single crystal have been proposed. Among them, a Czochralski method (hereinafter, referred to as a CZ method) is the most common silicon single crystal manufacturing method. In the CZ method of growing a silicon single crystal, polysilicon is melted in a crucible to form a silicon melt. Then, a seed crystal is deposited to the silicon melt, and the seed crystal is pulled up at a predetermined rotational speed and a predetermined pulling speed to grow a cylindrical silicon single crystal below the seed crystal.

A silicon wafer, which is a material forming a semiconductor device, is obtained by slicing and polishing the silicon single crystal. In order to maintain various characteristics of the silicon wafer at a predetermined level or more, the diameter of a cylindrical portion of the silicon single crystal is controlled so as to be within a predetermined range when the silicon single crystal is grown. This is very important to improve product quality and reduce manufacturing costs.

For example, as a method of controlling the diameter of the cylindrical portion when growing the silicon single crystal, the following has been proposed: a method of calculating a difference between the measured value of the diameter of a silicon single crystal that is actually pulled up and a predetermined diameter value, and feeding back the difference to the temperature of a silicon melt and the pulling speed to control the diameter, thereby approximating the diameter of the silicon single crystal to the predetermined diameter (see Japanese Patent No. 6234593 and Japanese Patent No. 5279174).

However, the above-mentioned method of measuring the diameter of the pulled silicon single crystal, calculating the difference between the measured value and the predetermined diameter value, and feeding back the difference makes it difficult to accurately control the diameter of the silicon single crystal. That is, even though a diameter measuring position is set in the vicinity of a solid-liquid interface, it takes a long time for the actual diameter of the silicon single crystal to approximate the set value in the method of changing the temperature of the silicon melt or the pulling speed after a variation in the diameter of the silicon single crystal that has already been pulled up is detected. Therefore, a wave occurs due to the variation in the diameter of the silicon single crystal, and it is difficult to maintain the diameter of the cylindrical portion of the silicon single crystal to be constant.

Further, a method of using a high-brightness zone (which is referred to as a fusion ring) generated in a solid-liquid interface when a silicon single crystal is pulled up to control the diameter of the silicon single crystal has been proposed (see JP-A-7-309694). The fusion ring is a ring-shaped high-brightness region that is generated so as to surround the silicon single crystal at the solid-liquid interface when radiation light from the wall of a crucible is reflected to the surface of a silicon melt that arises by the surface tension of the silicon single crystal during a pulling process. Therefore, the fusion ring is regarded as an inclined plane, and the angle of the inclined plane is continuously measured to detect a variation in the inclination angle of the fusion ring. In this way, a variation in the diameter of the silicon single crystal is detected.

Furthermore, a structure that controls radiation light from a crucible to detect the width or diameter of a fusion ring which is regarded as an inclined plane has been known (see JP-A-2005-41705).

However, in the method of measuring the angle or diameter of the fusion ring which is regarded as an inclined plane and detecting the diameter of the silicon single crystal on the basis of the measured results, the interface of the fusion ring, which is a detection target, is unclear, and it is difficult to accurately detect the width or diameter of the fusion ring. Therefore, it is difficult to feed back a variation in the width or diameter of the fusion ring to accurately control the diameter of the silicon single crystal.

DISCLOSURE OF THE PRESENT INVENTION

Problems that the Present Invention is to Solve

The present invention has been made in order to solve the above problems, and an object of the present invention is to provide a silicon single crystal pulling method of accurately controlling the diameter of a silicon single crystal when the silicon single crystal is pulled up from a silicon melt by a Czochralski method, thereby obtaining a high-quality silicon single crystal with little crystal defect.

Means for Solving the Problems

In order to solve the above problems, the present invention provides the following silicon single crystal pulling method.

That is, according to an aspect of the present invention, a silicon single crystal pulling method includes: a melting step of melting polycrystalline silicon in a crucible to form a silicon melt in the crucible; and a pulling step of pulling a silicon single crystal from the silicon melt using a Czochralski method. The pulling step includes: capturing an image of the silicon single crystal using an imaging device; measuring the brightness distribution of a fusing ring generated in the vicinity of a solid-liquid interface between the silicon melt and the silicon single crystal for each image scan line in the image captured by the imaging device; detecting the liquid level of the silicon melt and the position of the solid-liquid interface; and controlling the diameter of the silicon single crystal on the basis of a meniscus height, which is a difference between the liquid level and the position of the solid-liquid interface.

According to the above-mentioned silicon single crystal pulling method, a brightness measuring unit is used to measure the brightness distribution of the fusion ring in the direction in which the silicon single crystal is pulled up for each image scan line, and the liquid level of the silicon melt and the position of the solid-liquid interface are detected on the basis of the measured brightness distribution. Then, a variation in the height of a meniscus, which is a difference between the liquid level and the position of the solid-liquid interface, is continuously monitored (measured). Therefore, it is possible to detect a variation in the diameter of the silicon single crystal early. As a result, it is possible to rapidly and reliably control the diameter of the silicon single crystal.

The fusion ring has a ring shape having the single crystal as the center, and is an uneven surface whose curvature slightly varies radially from the lower end of the single crystal having a substantially cylindrical shape to a melt surface, which is a horizontal plane. In the silicon single crystal pulling method according to the present invention, the height of the fusion ring in the direction in which the crystal is pulled up, that is, a meniscus height is accurately measured, and it is possible to accurately control the diameter of the crystal on the basis of a variation in the meniscus height.

As described above, the method of using the brightness distribution of the fusion ring in the direction in which the silicon single crystal is pulled up to control the diameter of the silicon single crystal can rapidly and accurately detect a variation in the diameter of the silicon single crystal that is being pulled up, as compared to a method according to the related art that detects a variation in the inclination angle or diameter, which is a length in the horizontal direction, of a fusion ring that is regarded as an inclined plane and has an unclear solid-liquid interface.

In the present invention, in order to accurately perform pulling control, a fusion ring having a shape corresponding to a quarter of the inner lower side of a doughnut-shaped curved surface is measured as a curved surface, and the dimensions of the fusion ring in the pulling direction, that is, a meniscus height is set as a parameter related to a diameter variation, which has not been proposed in the related art.

Therefore, it is possible to rapidly feed back, for example, the pulling speed of the silicon single crystal and the output of a heater to a means that controls the diameter of a silicon single crystal, such that the diameter of the silicon single crystal falls in a predetermined value range before the diameter of the silicon single crystal considerably deviates from a predetermined value range. In this way, it is possible to obtain a high-quality silicon single crystal with little crystal defect that has a cylindrical portion with a constant diameter.

The meniscus height may be a difference between the liquid level and the position of the solid-liquid interface.

Specifically, the position of the solid-liquid interface is obtained by approximating the graph shape of a brightness peak portion of the fusion ring to a circle and calculating the central position of the approximate circle. The liquid level is the central position of an approximate circle calculated by a base portion of the fusion ring closer to the silicon melt side than to the brightness peak portion. The meniscus height is the difference between the two positions. In order to detect a base portion of the fusion ring required to calculate the liquid level, the value of the brightness peak portion of the fusion ring used to detect the solid-liquid interface is multiplied by a predetermined threshold percent. It is preferable that the threshold percent be in the range of 70% to 90%. In addition, the diameter control of the silicon single crystal may be performed by controlling the pulling speed of the silicon single crystal and the temperature of the silicon melt.

Specifically, the pulling speed of the silicon single crystal and the temperature of the silicon melt are controlled such that the meniscus height is equal to a height where the diameter variation of the single crystal is zero. In general, a PID control method is used to control the pulling speed and the temperature, but other methods may be used. In this case, a target meniscus height is needed. A height at which the diameter variation is zero is set as the target meniscus height in advance by a test.

When a camera is used to capture the image of the inside of a furnace during a pulling process, the camera captures the furnace in the oblique direction from the upper side, and the solid-liquid interface of a central portion of the crystal is concealed due to the field angle of the camera. Therefore, it is difficult to observe the entire fusion ring in the vicinity of the central portion of the crystal. In the present invention, the range of the silicon fusion ring used to measure the liquid level and the position of the solid-liquid interface may be limited to fusion ring data that is spaced a predetermined distance away from the center of the crystal being pulled up. The predetermined distance set during measurement depends on camera installation conditions, optical conditions, such as the focal length of a lens, and the size and shape of a crystal to be measured. Actually, it is preferable that an offset be added to the distance determined under the above-mentioned conditions and the offset be about 10 mm. In this way, it is possible to improve the measurement accuracy of the liquid level and the position of the solid-liquid interface. When the offset is out of the above-mentioned range, it is difficult to accurately measure the liquid level and the position of the solid-liquid interface, which is not preferable.

In the case in which the camera is used to measure the diameter, when the distance to a measurement target varies, the size of the appearance of the target also varies. It is possible to perform correction on the basis of the distance to the measurement distance, when converting the size of the appearance into the actual size of the target. However, in this case, it is necessary to measure a variation in the distance of the target. In the present invention, it is possible to control the liquid level by controlling the position of the crucible to a predetermined position on the basis of data of the measured liquid level. In this way, it is possible to remove the influence of the measured value of the meniscus height on the variation in the liquid level. In general, the predetermined position of the crucible is determined by the pulling conditions of a crystal, and the position of the crucible does not need to be fixed during the pulling process.

Advantages of the Present Invention

According to the silicon single crystal pulling method of the above-mentioned aspect of the present invention, a meniscus height, which is a difference between the liquid level and the position of the solid-liquid interface calculated by a fusion ring, is used to control the diameter of a silicon single crystal. According to this structure, it is possible to rapidly feed back, for example, the pulling speed of the silicon single crystal and the temperature of a silicon melt to a means that controls the diameter of the silicon single crystal, such that the diameter of the silicon single crystal falls in a predetermined value range before the diameter of the silicon single crystal considerably deviates from the predetermined value range. In addition, it is possible to control the liquid level to a predetermined height on the basis of the detected liquid level. In this way, it is possible to obtain a high-quality silicon single crystal with little crystal defect that has a cylindrical portion having a constant diameter, at a predetermined liquid level.

REFERENCE NUMERALS

10: Single crystal pulling apparatus
11: Crucible
13: Silicon melt
15: Silicon single crystal
16: Brightness measuring unit

BEST MODE FOR CARRYING OUT THE PRESENT INVENTION

Hereinafter, a silicon single crystal pulling method according to an exemplary embodiment of the present invention will be described with reference to the accompanying drawings. This embodiment is an illustrative example for easy comprehension of the present invention, but does not limit the present invention.

Figure 1:
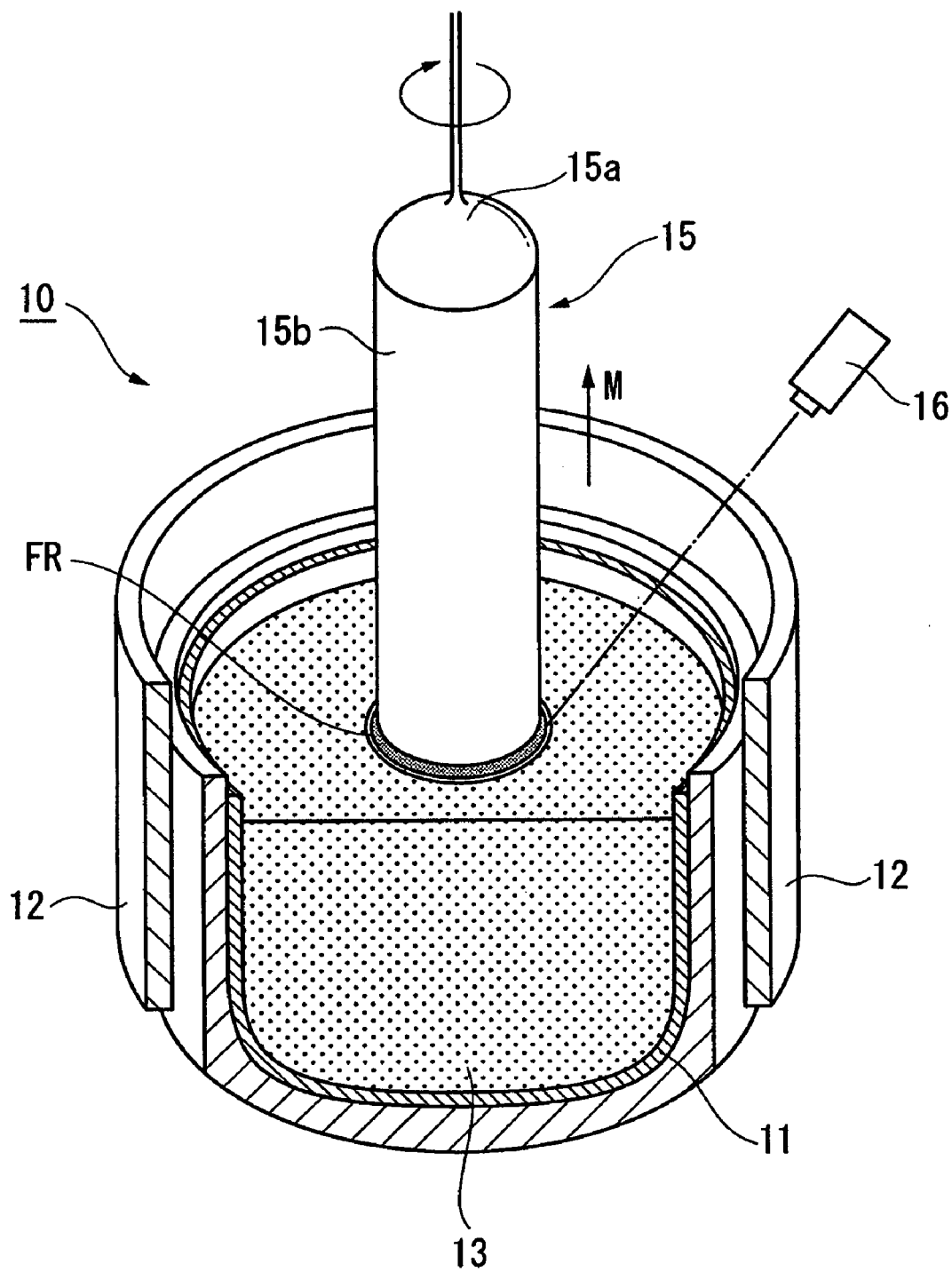
FIG. 1 is a diagram illustrating a silicon single crystal pulling method according to the present invention.

FIG. 1 is a diagram illustrating an example of pulling (growing) a silicon single crystal using the Czochralski method. In the silicon single crystal pulling method, polysilicon is put into a crucible 11 that is formed of, for example, quartz in a single silicon pulling apparatus 10, and a heater 12 arranged so as to surround the crucible 11 is turned on to heat the crucible 11. Then, the polysilicon is melted, and a silicon melt 13 is formed in the crucible 11 (melting process).

Then, a seed crystal comes into contact with the silicon melt 13, and the seed crystal is pulled up while being rotated at a predetermined rotational speed to form a shoulder portion 15a having a diameter that gradually increases. Then, a cylindrical portion 15b having a predetermined diameter is grown to obtain a silicon single crystal 15 having a predetermined length.

When the silicon single crystal 15 is grown, it is important to pull up the single silicon crystal while maintaining the diameter of the cylindrical portion 15b to be constant, in order to obtain a high-quality silicon single crystal with little crystal defect. In the silicon single crystal pulling method according to the present invention, when the silicon single crystal 15 is pulled up (grown), a brightness measuring unit 16 is used to measure the brightness of a fusion ring FR generated in the vicinity of a solid-liquid interface between the silicon melt 13 and the silicon single crystal 15.

The fusion ring FR is a ring-shaped high-brightness region that is generated so as to surround the silicon single crystal at the solid-liquid interface when radiation light from the wall of the crucible is reflected to the surface of the silicon melt that arises by the surface tension of the silicon single crystal during a pulling process.

In this embodiment of the present invention, while the silicon single crystal 15 is being grown, the brightness measuring unit 16 continuously measures the brightness of the fusion ring FR. In the measurement process, the brightness distribution of the fusion ring FR in the horizontal direction in an image is measured. Then, the liquid level of the silicon melt 13 and the position of the solid-liquid interface are detected on the basis of the measured brightness distribution of the fusion ring FR.

Figure 2:
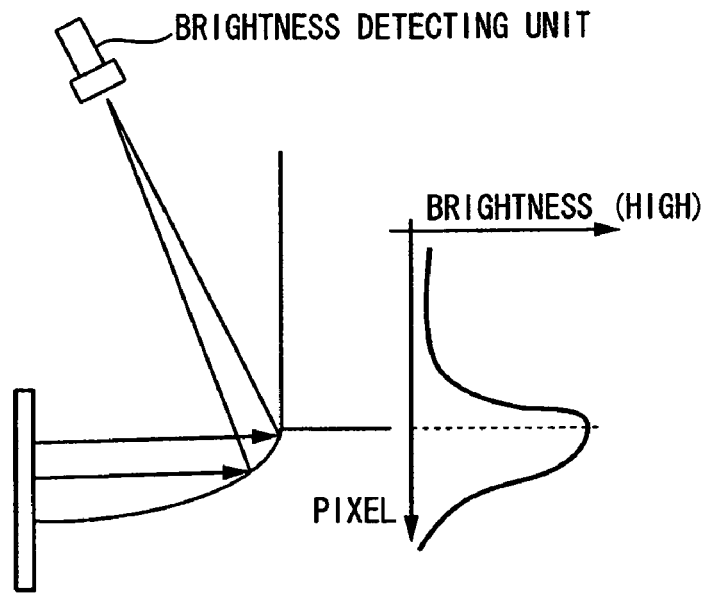
FIG. 2 is a diagram illustrating the brightness distribution of a fusion ring.

For example, a graph shown on the right side of FIG. 2 shows the brightness distribution of the fusion ring FR measured by the brightness measuring unit 16. That is, the peak of the brightness of the fusion ring FR corresponds to the solid-liquid interface of the silicon single crystal 15, and a base portion of the brightness of the fusion ring FR corresponds to an inclined portion of the silicon melt 13. Therefore, the central position of an approximate circle calculated by a peak brightness portion of the fusion ring FR corresponds to the position of the solid-liquid interface of the silicon single crystal. Data of the base portion of the fusion ring FR is used to detect the position of a melt portion below the solid-liquid interface.

Figure 3:
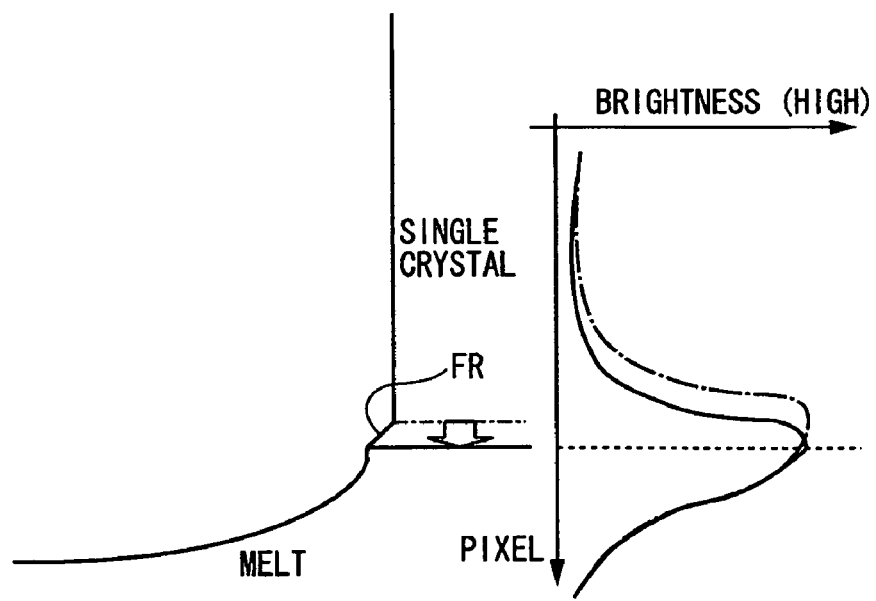
FIG. 3 is a diagram illustrating the brightness distribution of the fusion ring.

Then, when the diameter of the cylindrical portion 15b varies while the silicon single crystal 15 is being pulled up, the position of the solid-liquid interface of the single crystal also varies. For example, when the diameter of the silicon single crystal is decreased during the pulling process, the solid-liquid interface is moved down. At that time, as shown in FIG. 3, the peak of the brightness of the fusion ring FR varies. At the peak of the brightness of the fusion ring FR, the position of the solid-liquid interface when the diameter of the silicon single crystal varies is reflected. Therefore, it is possible to detect a variation in the height of the solid-liquid interface when the diameter of the silicon crystal varies by using the measurement results of the brightness of the fusion ring FR to calculate the central position of the approximate circle in the vicinity of the brightness peak continuously or at a predetermined time interval.

As described above, the brightness measuring unit 16 is used to measure the brightness distribution of the fusion ring FR in the direction in which the silicon single crystal is pulled up, and the liquid level of the silicon melt and the position of the solid-liquid interface are detected on the basis of the measured brightness distribution. Then, a variation in the height of a meniscus, which is a difference between the liquid level and the position of the solid-liquid interface, is monitored (measured) continuously or at a predetermined time interval. Therefore, it is possible to detect a variation in the diameter of the silicon single crystal early. As a result, it is possible to rapidly and reliably control the diameter of the silicon single crystal.

The method of using the brightness distribution of the fusion ring FR in the direction in which the silicon single crystal is pulled up to control the diameter of the silicon single crystal can rapidly and accurately detect a variation in the diameter of the silicon single crystal that is being pulled up, as compared to a method according to the related art that detects a variation in the width or diameter of a fusion ring having an unclear solid-liquid interface.

Therefore, it is possible to rapidly feed back, for example, the pulling speed of the silicon single crystal and the temperature of the silicon melt to a means that controls the diameter of the silicon single crystal, such that the diameter of the silicon single crystal falls in a predetermined value range before the diameter of the silicon single crystal considerably deviates from the predetermined value range. In this way, it is possible to obtain a high-quality silicon single crystal with little crystal defect that has the cylindrical portion 15b having a constant diameter.

EXAMPLES

Figure 4:
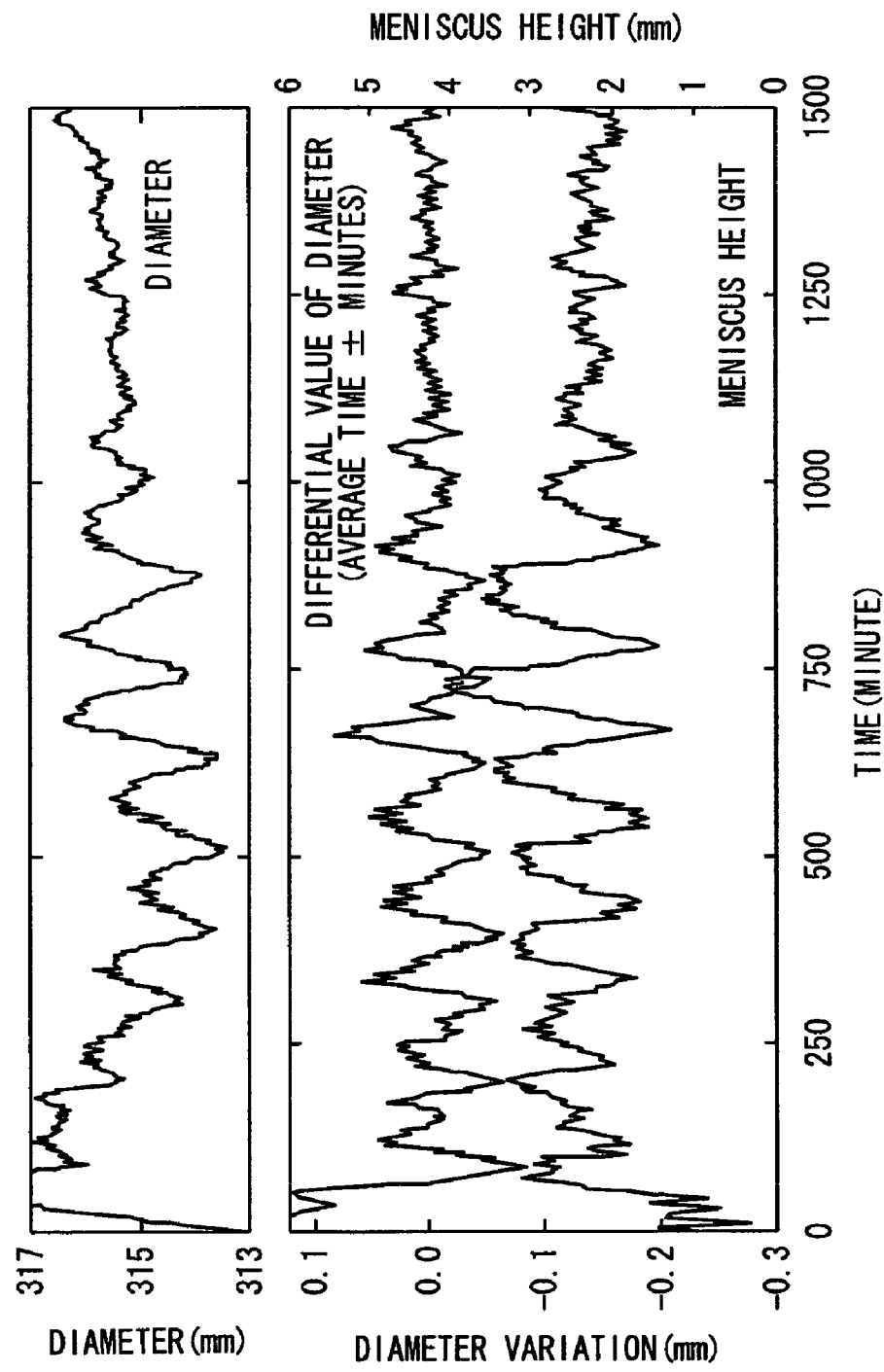
FIG. 4 is a graph illustrating a diameter variation and a meniscus height in the silicon single crystal pulling method according to the present invention.

FIG. 4 is a graph illustrating the diameter of a silicon single crystal, a diameter variation (the differential value of the diameter), and the meniscus height of a silicon melt actually measured by the single crystal pulling apparatus. The measurement results shown in FIG. 4 proved that the variation in the diameter of the silicon single crystal and the meniscus height were substantially opposite to each other in phase.

Figure 5:
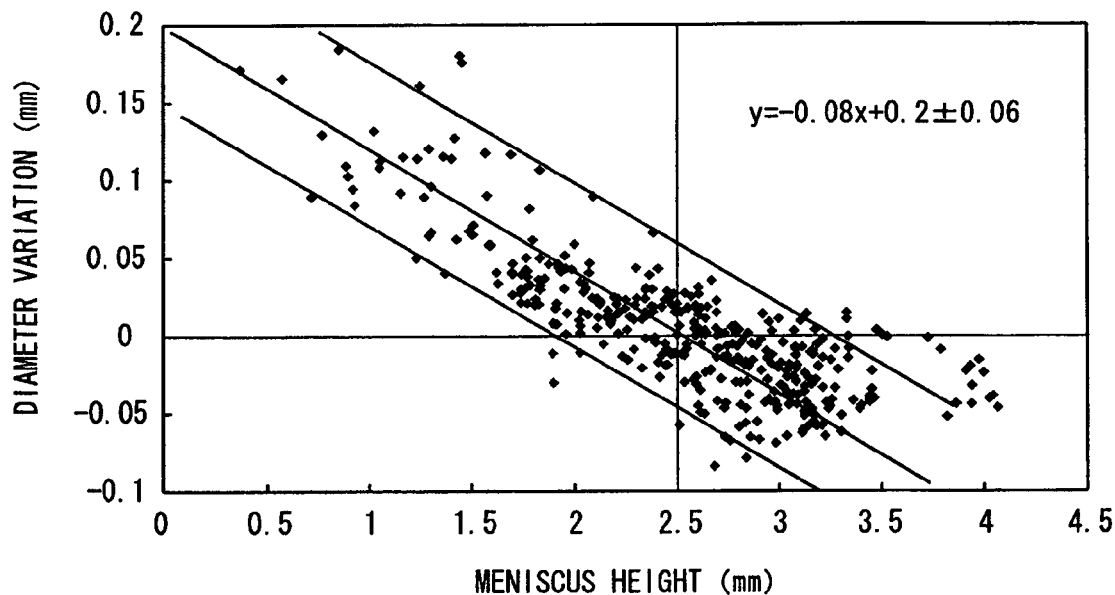
FIG. 5 is a correlation diagram illustrating a correlation between the diameter variation and the meniscus height in the silicon single crystal pulling method according to the present invention.

FIG. 5 is a distribution chart illustrating the correlation between the variation in the diameter of the silicon single crystal and the meniscus height shown in FIG. 4. As can be seen from FIG. 5, when the diameter of the silicon single crystal is increased during the pulling process, the meniscus height is decreased. On the other hand, when the diameter of the silicon single crystal is decreased, the meniscus height is increased.

The single crystal pulling apparatus according to the related art inputs a diameter value, and performs a PID operation to control the pulling speed and the temperature of a heater on the basis of a difference between a target value and the diameter value actually measured, thereby controlling the diameter of a single crystal. However, when the diameter of the silicon single crystal is increased and the input of poly silicon is increased in an initial stage, it is difficult to control the diameter of the silicon single crystal during a pulling process.

Therefore, a diameter variation was input instead of the measured diameter value. That is, the diameter was controlled such that the diameter variation became a target value (the diameter variation was zero in the cylindrical portion). In this way, it was possible to control the diameter of the silicon single crystal earlier than the diameter control method according to the related art, and thus improve a diameter control property.

However, as can be seen from the graph shown in FIG. 4, it is necessary to improve an SN using, for example, a moving average, in order to calculate the diameter variation that can be actually applied to diameter control. Therefore, the effect of performing diameter control at an early timing, which is obtained by the use of the diameter variation, is cancelled.

Meanwhile, in the present invention, although the meniscus height has no moving average value, it ensures substantially the same SN as the result of the diameter variation of the silicon single crystal, and it is not necessary to process the moving average. Therefore, it is possible to perform diameter control at an earlier timing than a diameter control method using the meniscus height. As a result, it is possible to significantly improve a diameter control property.

In the diameter control method using the meniscus height, a target meniscus height is set on the basis of diameter correlation analysis for the variation in diameter shown in FIG. 5. For example, in the graph shown in FIG. 4, a target meniscus height is 2.5 mm, and a diameter variation is 0 mm at the meniscus height of 2.5 mm. Therefore, the pulling speed and the temperature of the heater (the temperature of the silicon melt) may be controlled by a PID operation on the basis of the meniscus height such that the cylindrical portion of the silicon single crystal has a meniscus height of 2.5 mm.

As can be seen from FIG. 5, the meniscus height and the diameter variation are proportional to each other at a gradient of −0.08, and the correlation coefficient thereof is greater than or equal to 0.8. Therefore, the relationship between the meniscus height and the diameter variation is represented by $y=-0.08x+0.2$. That is, it is possible to control the pulling speed and the temperature of the heater in correspondence with a variation in the meniscus height, on the basis of the correlation.

When the meniscus height is increased, the pulling speed is lowered or the temperature of the heater is reduced. On the other hand, when the meniscus height is decreased, the pulling speed is increased or the temperature of the heater is increased.

Figure 6:
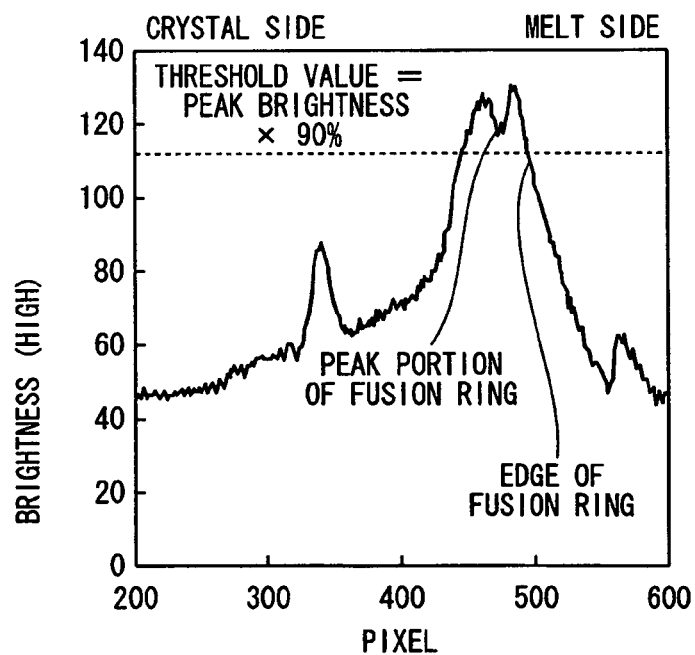
FIG. 6 is a graph illustrating an example of a method of setting the threshold value of the brightness distribution.

When the meniscus height is calculated, the edge of the fusion ring FR indicating the liquid level of the silicon melt may be set to a brightness threshold value obtained by multiplying a brightness peak value obtained from the brightness distribution of the fusion ring by a predetermined threshold percent. For example, as shown in the graph of FIG. 6, a threshold percent of 90% may be set to the brightness peak value of the fusion ring, and an intersection of the horizontal axis indicating the threshold percent of 90% and a connection line indicating the brightness distribution may indicate the brightness threshold value, that is, the liquid level of the silicon melt. The threshold percent may be in the range of 70 to 95%, for example, 90% with respect to the brightness peak value.

The invention claimed is:

1. A silicon single crystal pulling method comprising:

a melting step of melting polycrystalline silicon in a crucible to form a silicon melt in the crucible; and a pulling step of pulling a silicon single crystal from the silicon melt using a Czochralski method, wherein the pulling step includes:

capturing an image of the silicon single crystal using an imaging device;

measuring the brightness distribution of a fusion ring generated in the vicinity of a solid-liquid interface between the silicon melt and the silicon single crystal for each image scan line in the image captured by the imaging device;

detecting the liquid level of the silicon melt and the position of the solid-liquid interface on the basis of the measured brightness distribution; and controlling the diameter of the silicon single crystal on the basis of a meniscus height, which is a difference between the liquid level and the position of the solid-liquid interface.

2. The silicon single crystal pulling method according to claim 1, wherein the meniscus height is a difference between the position of the solid-liquid interface, which is the central position of an approximate circle calculated by a brightness peak portion having the highest brightness in the brightness distribution of the fusion ring generated in the vicinity of the solid-liquid interface, which is measured for each scan line of the image, and the liquid level, which is the central position of an approximate circle calculated by a base portion of the brightness distribution of the silicon melt rather than the brightness peak portion.

3. The silicon single crystal pulling method according to claim 2, wherein the base portion of the brightness distribution when the liquid level is calculated is detected by a brightness threshold value obtained by multiplying the value of the brightness peak portion by a predetermined threshold percent, and the threshold percent is in the range of 70% to 90%.

4. The silicon single crystal pulling method according to claim 3,
wherein the diameter control of the silicon single crystal is performed by controlling the pulling speed of the silicon single crystal and the temperature of a heater that heats the silicon melt.

5. The silicon single crystal pulling method according to claim 3,
wherein the range of the silicon fusion ring used to measure the liquid level and the position of the solid-liquid interface is limited to fusion ring data that is spaced a predetermined distance away from the center of the single crystal being pulled up.

6. The silicon single crystal pulling method according to claim 3,
wherein the position of the crucible is controlled at a predetermined position on the basis of the liquid level, such that the liquid level is controlled.

7. The silicon single crystal pulling method according to claim 2,
wherein the diameter control of the silicon single crystal is performed by controlling the pulling speed of the silicon single crystal and the temperature of a heater that heats the silicon melt.

8. The silicon single crystal pulling method according to claim 2,
wherein the range of the silicon fusion ring used to measure the liquid level and the position of the solid-liquid interface is limited to fusion ring data that is spaced a predetermined distance away from the center of the single crystal being pulled up.

9. The silicon single crystal pulling method according to claim 2,
wherein the position of the crucible is controlled at a predetermined position on the basis of the liquid level, such that the liquid level is controlled.

10. The silicon single crystal pulling method according to claim 1,
wherein the diameter control of the silicon single crystal is performed by controlling the pulling speed of the silicon single crystal and the temperature of a heater that heats the silicon melt.

11. The silicon single crystal pulling method according to claim 1,
wherein the range of the silicon fusion ring used to measure the liquid level and the position of the solid-liquid interface is limited to fusion ring data that is spaced a predetermined distance away from the center of the single crystal being pulled up.

12. The silicon single crystal pulling method according to claim 1, wherein
the position of the crucible is controlled at a predetermined position on the basis of the liquid level, such that the liquid level is controlled.

\* \* \* \* \*